(12) United States Patent  
Lee et al.

(10) Patent No.: US 12,396,098 B2
(45) Date of Patent: Aug. 19, 2025

(54) OPTICAL COMMUNICATION MODULE

(71) Applicant: OPTICIS CO., LTD., Seongnam-si (KR)

(72) Inventors: Hyun Sik Lee, Gwangju (KR); Hee Dae Kim, Gwangju (KR)

(73) Assignee: OPTICIS CO., LTD., Seongnam-si (KR)

(*) Notice: Subject to any disclaimer, the term of this patent is extended or adjusted under 35 U.S.C. 154(b) by 308 days.

(21) Appl. No.: 18/107,916

(22) Filed: Feb. 9, 2023

(65) Prior Publication Data

US 2023/0262894 A1 Aug. 17, 2023

(30) Foreign Application Priority Data

Feb. 11, 2022 (KR) .................... 10-2022-0018329

(51) Int. Cl.
*H04B 10/50* (2013.01)
*H05K 1/11* (2006.01)

(52) U.S. Cl.
CPC ............. *H05K 1/117* (2013.01); *H05K 1/118* (2013.01); *H05K 2201/051* (2013.01); *H05K 2201/09236* (2013.01)

(58) Field of Classification Search
CPC ....................................................... H04B 10/50
See application file for complete search history.

(56) References Cited

U.S. PATENT DOCUMENTS 7,264,405 B2 9/2007 Ikeuchi
7,751,660 B2 7/2010 Ueno et al.
(Continued)

FOREIGN PATENT DOCUMENTS

JP 03-004465 1/1991
JP H06-36385 B2 5/1994
(Continued)

OTHER PUBLICATIONS

Korean Office Action for App. No. 2022-0018329, mailed Dec. 20, 2023 (13 pages).
(Continued)

*Primary Examiner* — Shi K Li
(74) *Attorney, Agent, or Firm* — NIXON PEABODY LLP; Jeffrey L. Costellia

(57) ABSTRACT

An optical communication module is provided, including an input/output connector on one end through which a multi-signal including a video signal is input/output, an optical sub assembly (OSA) package on another end for converting the multi-signal into an optical signal, and a first connection end folded in a curved form so that a connection surface as one surface on which a first contact point is formed forms an outer circumference and a non-connection surface as another surface on which the first contact point is not formed forms an inner circumference to form upper and lower double-sided contacts with the input/output connector. The optical communication module may simplify a contact point structure with an input/output connector and reduce its manufacturing costs, by improving the contact point structure with an input/output connector, and may provide a high-speed transmission line having a relatively-low dielectric loss with respect to a video signal requiring high-speed transmission in synchronization with a high-speed clock signal and also have an improved structure favorable to mounting of an integrated circuit for signal processing with respect to an auxiliary signal or a peripheral circuit device connected to the integrated circuit.

12 Claims, 7 Drawing Sheets

(56) References Cited

U.S. PATENT DOCUMENTS

| | | | |
|---|---|---|---|
| 7,948,760 B2 | 5/2011 | Kawauchi et al. | |
| 10,129,983 B2 | 11/2018 | Uchida et al. | |
| 2003/0235012 A1 | 12/2003 | Nishizawa | |
| 2005/0245103 A1 | 11/2005 | Ellison | |
| 2007/0058976 A1* | 3/2007 | Tatum | G02B 6/4246 398/99 |
| 2014/0029900 A1 | 1/2014 | Logan, Jr. et al. | |
| 2022/0006222 A1 | 1/2022 | Moll et al. | |
| 2024/0126029 A1* | 4/2024 | Blanc | G02B 6/4292 |

FOREIGN PATENT DOCUMENTS

| | | |
|---|---|---|
| JP | H06-208873 A | 7/1994 |
| JP | 2004-039543 A | 2/2004 |
| JP | 2005-123055 | 5/2005 |
| JP | 2005-217284 | 8/2005 |
| JP | 2006-086433 A | 3/2006 |
| JP | 2014-021462 | 2/2014 |
| JP | 2018-133478 | 8/2018 |
| KR | 2002-0033922 | 5/2002 |
| KR | 2008-0059018 | 6/2008 |

OTHER PUBLICATIONS

Extended European Search Report for App. No. 23156078.0, mailed Jun. 21, 2023 (9 pages).

Japanese Office Action for App. No. 2023-018171, mailed Jan. 23, 2024 (8 pages).

Japanese Office Action for App. No. 2023-018171, mailed May 31, 2024 (9 pages) [English Translated].

European Office Action for European App No. 23 156 078.0, mailed Jun. 6, 2025, (10 pages).

* cited by examiner

OPTICAL COMMUNICATION MODULE

CROSS-REFERENCE TO RELATED APPLICATION

This application is based on and claims priority under 35 U.S.C. § 119 to Korean Patent Application No. 10-2022-0018329, filed on Feb. 11, 2022, in the Korean Intellectual Property Office, the disclosure of which is incorporated by reference herein in its entirety.

BACKGROUND

1. Field

One or more embodiments relate to an optical communication module.

2. Description of the Related Art

An optical communication module provides an interface for optical communication between a source device for generating a video signal and a sink device for implementing a video image from the video signal of the source device, and can include multi-signal lines including a video signal line for transmitting video data and an auxiliary signal line for transmitting auxiliary data related to configuration information of a source device or a sink device, in addition to the video data.

SUMMARY

One or more embodiments include an optical communication module capable of simplifying a contact structure with an input/output connector and reducing manufacturing costs, by improving the contact structure with the input/output connector.

One or more embodiments include an optical communication module capable of providing a high-speed transmission line having a relatively-low dielectric loss with respect to a video signal requiring high-speed transmission in synchronization with a high-speed clock signal and also having an improved structure favorable to mounting of an integrated circuit for signal processing with respect to an auxiliary signal or a peripheral circuit device connected to the integrated circuit.

Additional aspects will be set forth in part in the description which follows and, in part, will be apparent from the description, or may be learned by practice of the presented embodiments of the disclosure.

According to one or more embodiments, an optical communication module includes an input/output connector on one end through which a multi-signal including a video signal is input/output; an optical sub assembly (OSA) package on another end for converting the multi-signal into an optical signal; and a first connection end folded in a curved form so that a connection surface as one surface on which a first contact point is formed forms an outer circumference and a non-connection surface as another surface on which the first contact point is not formed forms an inner circumference to form upper and lower double-sided contacts with the input/output connector.

Along the outer circumference of the connection surface, a group of upper first contact points and a group of lower first contact points may be respectively formed on upper and lower sides that are opposite to each other, and a separation gap forming a curved portion may be interposed between the group of upper first contact points and the group of lower first contact points.

The group of lower first contact points may include different lower first contact points respectively formed on connection surfaces separated from each other along the outer circumference of the connection surface.

The optical communication module may further include a second connection end forming a contact point with the OSA package and bent so that the connection surface on which a second contact point is formed stands to face the OSA package.

The first and second connection ends may be formed as one end and another end of a flexible circuit board, and multi-signal lines may each extend between the first and second contact points by using the first contact point of the first connection end and the second contact point of the second connection end as the one end and the other end, respectively.

The flexible circuit board may continuously extend between the first and second connection ends.

Among multi-signal lines, a first group of signal lines may be completely formed on the flexible circuit board so as not to deviate from the flexible circuit board between the first and second contact points.

The first group of signal lines may transmit video signals.

Among multi-signal lines, a second group of signal lines may include a detour transmission path between a location deviating from the flexible circuit board and a location re-entering the flexible circuit board between the first and second contact points.

The second group of signal lines may transmit an auxiliary signal including information about at least one of a source device and a sink device through which the optical communication module provides a communication channel.

The detour transmission path may be provided as a rigid circuit board.

The second group of signal lines may include a transmission path of the flexible circuit board from the first contact point to the deviating location, a detour transmission path of a rigid circuit board from the deviating location to the re-entering location, and a transmission path of the flexible circuit board from the re-entering location to the second contact point.

An integrated circuit chip may be connected on the detour transmission path.

BRIEF DESCRIPTION OF THE DRAWINGS

The above and other aspects, features, and advantages of certain embodiments of the inventive concept will be more apparent from the following description taken in conjunction with the accompanying drawings, in which:

FIGS. 6A through 6C are cross-sectional views taken along line VI-VI of FIG. 3A, showing the configuration of a first connection end according to an embodiment, wherein FIG. 6A shows an unfolded configuration of the first connection end, FIG. 6B shows the first connection end folded in a curved form, and FIG. 6C schematically shows an electrical connection between the first connection end shown in FIG. 6B and an input/output connector.

DETAILED DESCRIPTION

Figure 1:
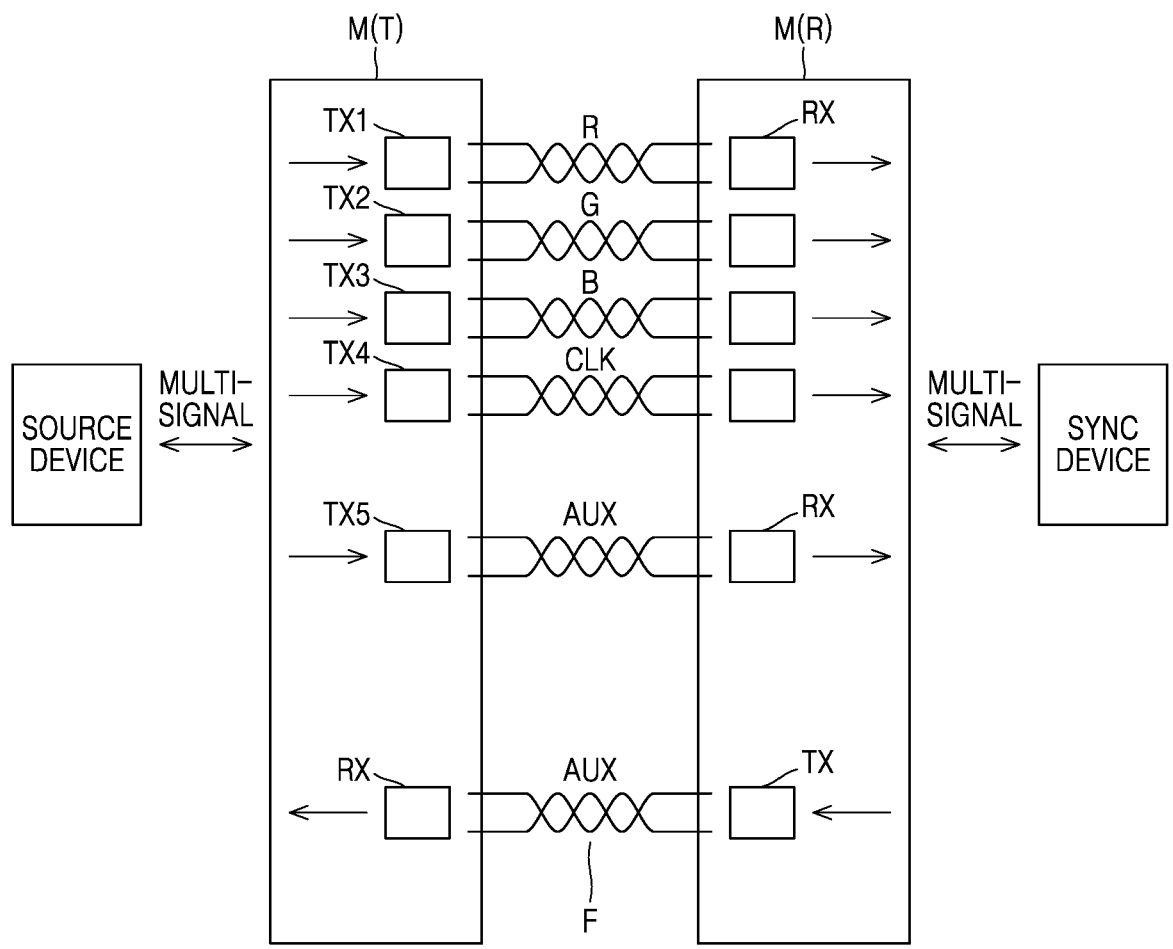
FIG. 1 is a diagram schematically showing an entire system to which an optical communication module according to the disclosure is applicable.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

An optical communication module according to an embodiment will now be described with reference to the accompanying drawings, in which embodiments are shown.

FIG. 1 is a diagram schematically showing an entire system to which an optical communication module M according to the disclosure is applicable.

The optical communication module M according to an embodiment provides an interface for optical communication between a source device for generating a video signal and a sink device for implementing a video image from the video signal of the source device, and may be connected to the source device for generating a video signal to form a transmission terminal side of an optical fiber F forming a communication line of optical communication (as indicated by M(T)) or may be connected to the sink device for receiving a video signal to form a reception terminal side of the optical fiber F forming a communication line of optical communication (as indicated by M(R)).

Figure 2:
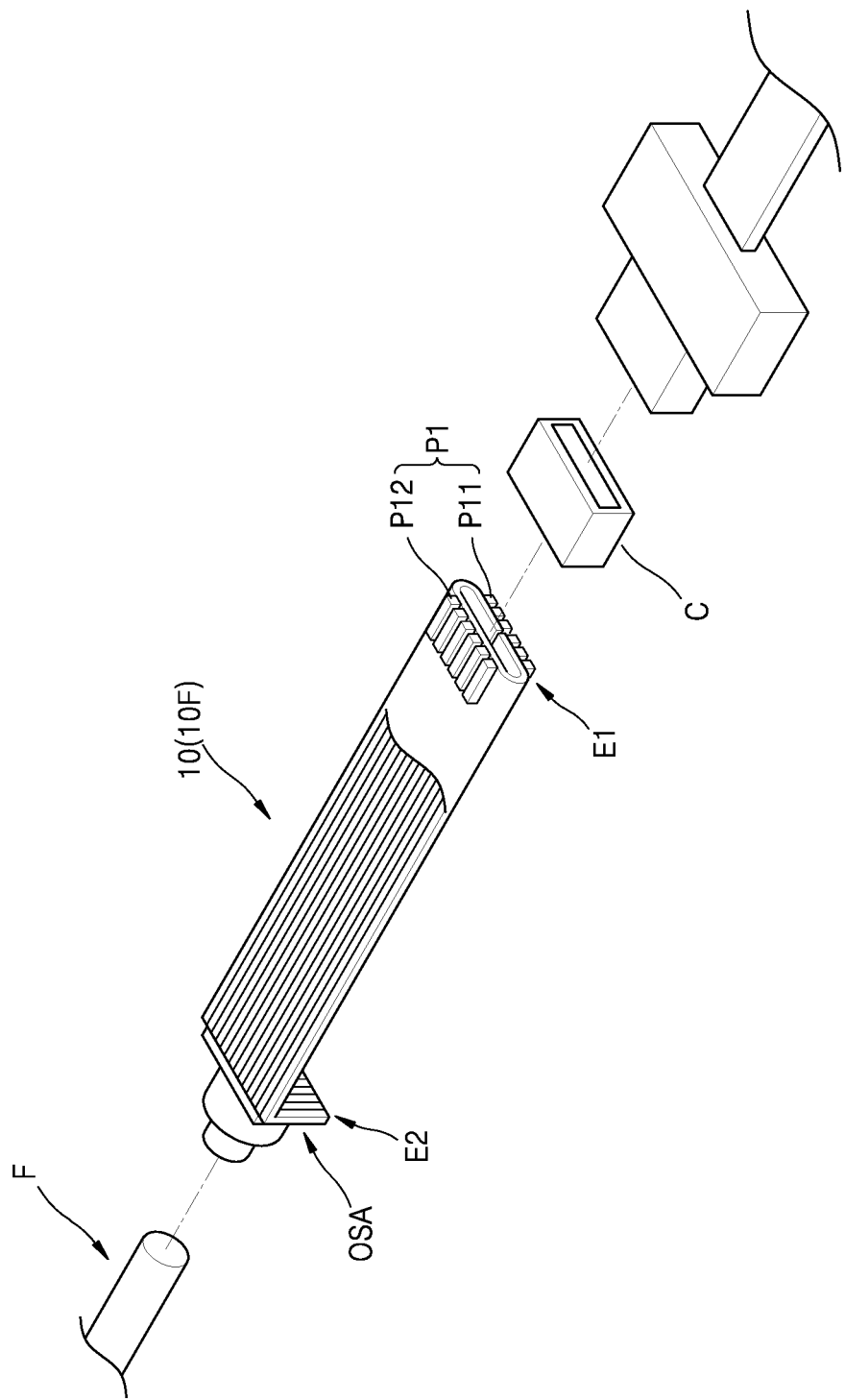
FIG. 2 is an exploded perspective view of an optical communication module according to a first embodiment.
Figure 3A:
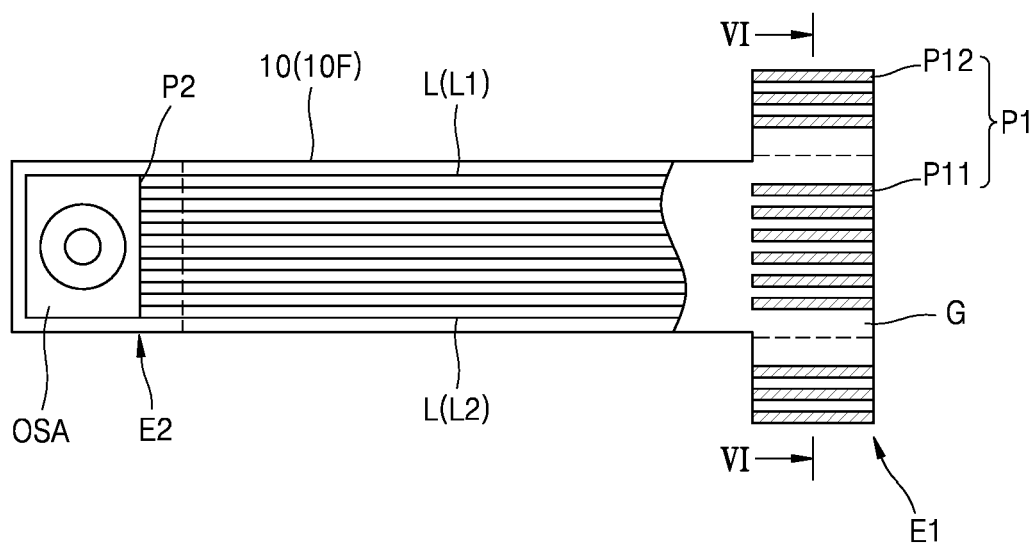
FIG. 3A is a top view showing a circuit board included in the optical communication module of FIG. 2 in an unfolded state.
Figure 3B:
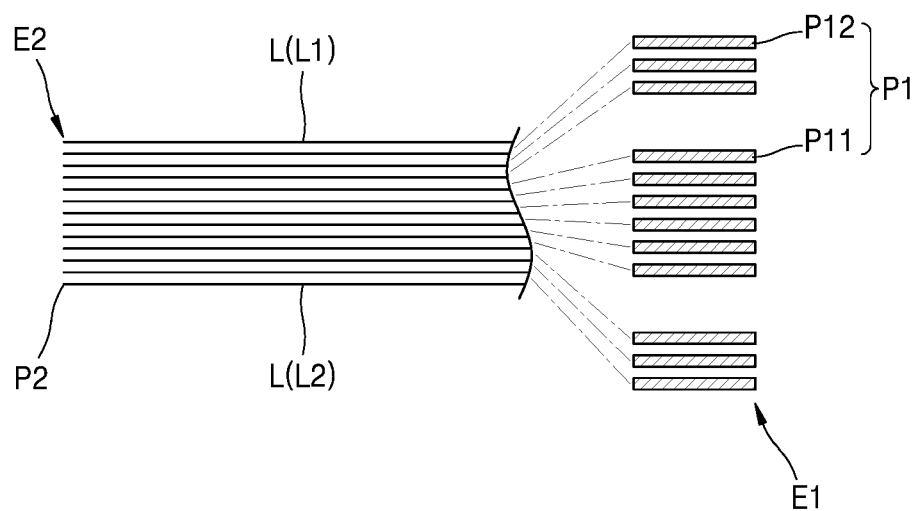
FIG. 3B is a schematic view showing an electrical connection of the optical communication module of FIG. 3A.

FIG. 2 is an exploded perspective view of the optical communication module M according to a first embodiment. FIG. 3A is a top view showing a circuit board 10 included in the optical communication module M of FIG. 2 in an unfolded state. FIG. 3B is a schematic view showing an electrical connection of the optical communication module M of FIG. 3A.

Figure 4A:
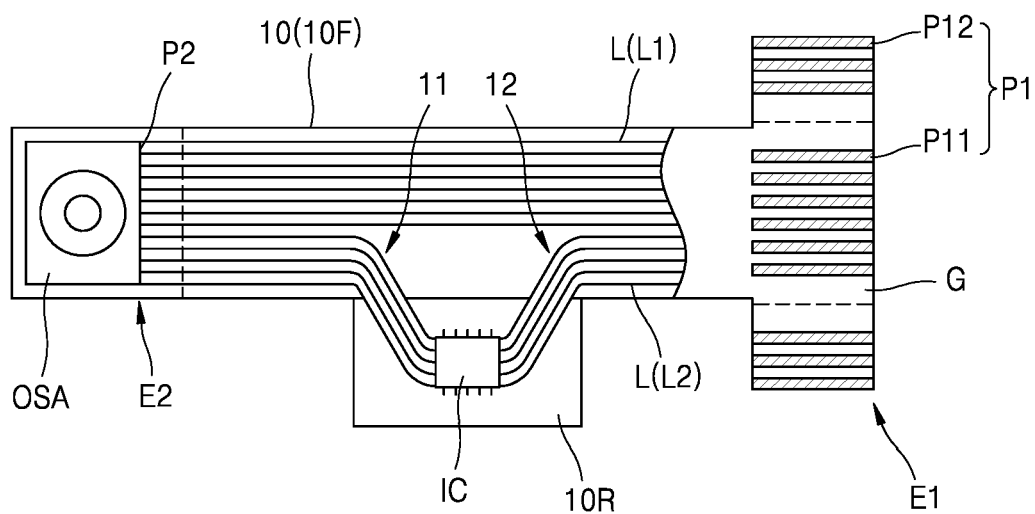
FIG. 4A is a top view showing a circuit board included in an optical communication module according to a second embodiment in an unfolded state.
Figure 4B:
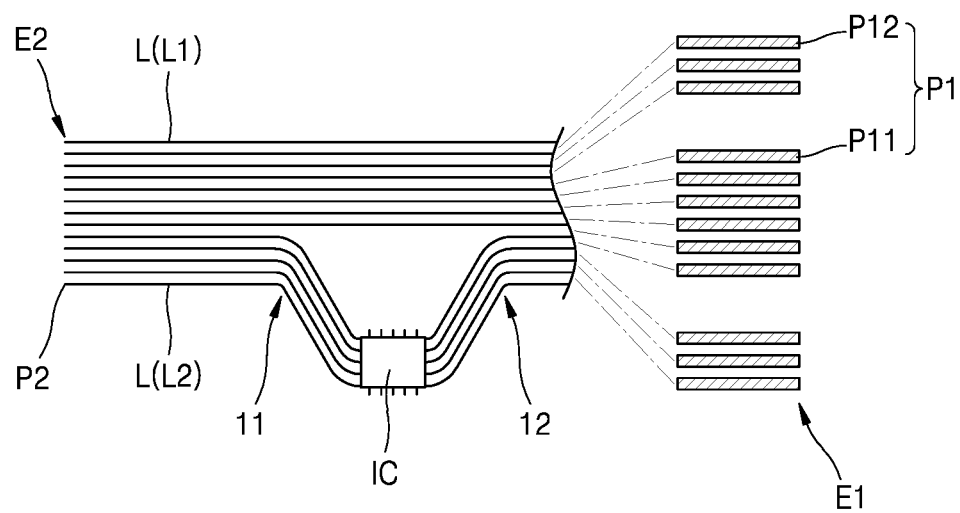
FIG. 4B is a schematic view showing an electrical connection of the optical communication module of FIG. 4A.

FIG. 4A is a top view showing a circuit board 10 included in an optical communication module M according to a second embodiment in an unfolded state. FIG. 4B is a schematic view showing an electrical connection of the optical communication module M of FIG. 4A.

Figure 5A:
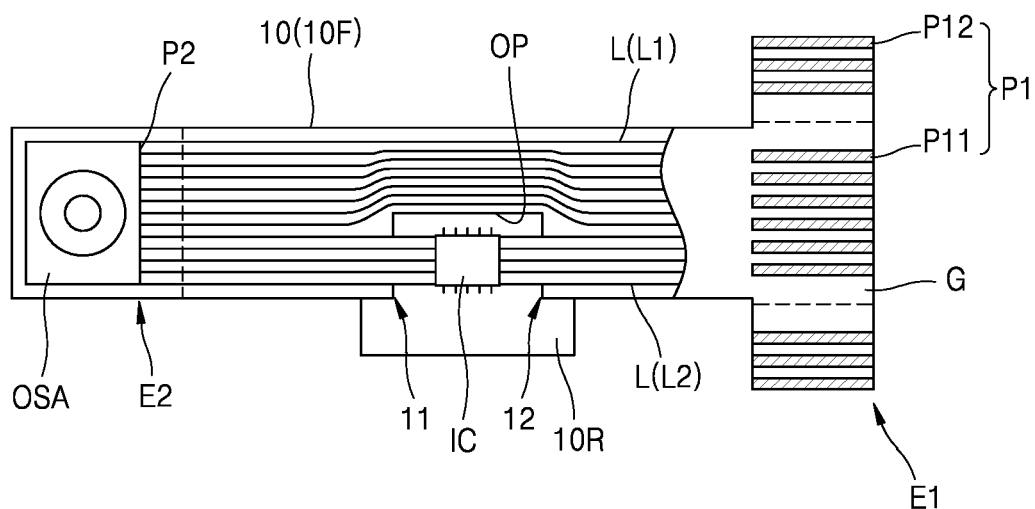
FIG. 5A is a top view showing a circuit board included in an optical communication module according to a third embodiment in an unfolded state.
Figure 5B:
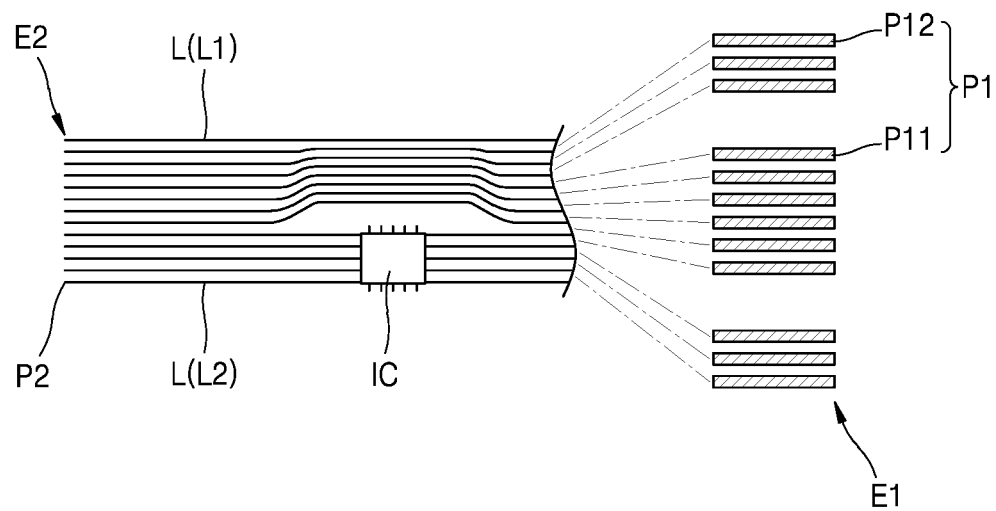
FIG. 5B is a schematic view showing an electrical connection of the optical communication module of FIG. 5A.

FIG. 5A is a top view showing a circuit board 10 included in an optical communication module M according to a third embodiment in an unfolded state. FIG. 5B is a schematic view showing an electrical connection of the optical communication module M of FIG. 5A.

Referring to FIGS. 1 through 5B, an optical communication module M according to an embodiment may include an input/output connector C of a multi-signal including a video signal, and an optical sub assembly (OSA) package OSA that converts an electrical signal received through the input/output connector C into an optical signal and transmits the optical signal through the optical fiber F (transmission terminal side) or converts an optical signal received through the optical fiber F into an electrical signal and transmits the electrical signal through the input/output connector C (reception terminal side), and may include a circuit board 10 forming multi-signal lines L between the input/output connector C and the OSA package OSA while forming an electrical contact with the input/output connector C and the OSA package OSA between the input/output connector C and the OSA package OSA. Through the present specification, the multi-signal lines L may refer to different transmission paths electrically insulated from each other in order to transmit different signals.

The optical communication module M according to an embodiment may form a communication channel between the source device generating a video signal and the sink device implementing a video image by receiving the video signal, and the optical communication module M may provide a bidirectional communication channel using one of the source device and the sink device as a transmission terminal and using the other as a reception terminal. The multi-signal lines L included in the optical communication module M may include video signal lines (first group of signal lines L1) for transmitting video signals and auxiliary signal lines (second group of signal lines L2) for transmitting auxiliary signals. Through the present specification, a video signal line may include a total of four channels, including three R, G, and B channels and a clock channel for transmitting R, G, and B video data in synchronization with a pixel clock. According to an embodiment, the video signal lines (first group of signal lines L1) including four channels may refer to each channel including a signal line for data communication and a ground line for sharing a common ground voltage and thus the video signal line including a total of 8 video signal lines (first group of signal lines L1).

The auxiliary signal lines (second group of signal lines L2) transmit auxiliary data related to Extended Display Identification Data (EDID), which is configuration information and control information of the sink device, and Display Port Configuration Data (DPCD), which is reception condition information of the sink device, and may include a total of two channels including one channel using the source device as a transmission terminal and the sink device as a reception terminal and another channel using the source device as the reception terminal and the sink device as the transmission terminal. According to an embodiment, the auxiliary signal lines (second group of signal lines L2) including two channels may refer to each channel including a signal line for data communication and a ground line for sharing a common ground voltage and thus the auxiliary signal line including a total of 4 auxiliary signal lines (second group of signal lines L2).

Through the present specification, the signal lines included in the multi-signal lines L refer to different transmission paths electrically insulated from each other in order to transmit different signals. Thus, according to an embodiment, the multi-signal lines L may include a total of 12 signal lines, including the 8 video signal lines (first group of signal lines L1) and the 4 auxiliary signal lines (second group of signal lines L2). However, the technical scope of the disclosure is not limited to the number of signal lines included in the multi-signal lines L. According to various embodiments, the number of signal lines included in the multi-signal lines L may increase or decrease.

The circuit board 10 may provide the multi-signal lines L while forming a contact with the input/output connector C and the OSA package, between the input/output connector C formed as a standard, such as a high definition multimedia interface (HDMI) or a display port (DP), and the OSA package OSA formed in a size of several mm in consideration of optical coupling with an optical communication line (optical fiber F), to enable compatible connection with respect to various source devices and sink devices.

Referring to FIGS. 3A and 3B, according to an embodiment, the circuit board 10 may include a first connection end E1 including a first contact point P1 with the input/output connector C and a second connection end E2 including a second contact point P2 with the OSA package OSA. For example, the circuit board 10 provides the multi-signal lines L including the video signal lines (first group of signal lines L1) and the auxiliary signal lines (second group of signal lines L2) between the input/output connector C and the OSA package OSA, and thus may include an insulating layer and a multi-signal lines L patterned on the insulating layer, for example, a plurality of conductive lines formed of thin metal wires.

According to various embodiments, the circuit board 10 forming the multi-signal lines L is provided only with a flexible circuit board 10F (first embodiment shown in FIG. 3A) or with a combination of the flexible circuit board 10F and a rigid circuit board 10R (second and third embodiments shown in FIGS. 4A and 5A), but may not provided only with the rigid circuit board 10R excluding the flexible circuit board 10F. The flexible printed circuit board 10F may include an insulating film having a thickness of a thin film as an insulating layer, and may include an insulating film made of polyimide. The rigid printed circuit board 10R may include an insulating substrate as an insulating layer, may have a larger thickness than an insulating film having a thin film thickness, and may include an insulating film made of FR-4. The flexible circuit board 10F and the rigid circuit board 10R may include insulating layers formed of different materials. The flexible circuit board 10F may intensively design a large number of integrated circuit (IC) chips, circuit devices, or wiring within a small area while facilitating warpage or bending of the first and second connection ends E1 and E2 forming both ends of the circuit board 10 by exhibiting relatively-high flexibility. The rigid circuit board 10R may intensively design a large number of IC chips, circuit devices, or wiring within a small area while stably supporting an IC mounted on the circuit board 10 or circuit devices around the IC or stably supporting a plurality of wires connected to the circuit devices by exhibiting relatively-high rigidity. For example, the insulating layers of the flexible circuit board 10F and the rigid circuit board 10R may be formed of different materials, may have different dielectric constants or different capacitances, and provide a high-speed transmission path having a relatively-low dielectric loss with respect to a video signal or provide a relatively low-speed transmission path easy to achieve circuit connection for signal processing with respect to an auxiliary signal.

The circuit board 10 may not only simply provide the multi-signal lines L between the input/output connector C and the OSA package OSA, but also may perform signal processing, for example, processing of different types of data obtained through one or a plurality of different signal lines together with fields indicating the different types of data into a single data packet form, between the input/output connector C and the OSA package OSA. The circuit boards 10 according to the second and third embodiments shown in FIGS. 4A and 5A may include an IC connected between the first and second connection ends E1 and E2 for such signal processing. For example, according to an embodiment, the circuit board 10 may include an IC chip connected between the first and second connection ends E1 and E2.

According to an embodiment, the circuit board 10 may be configured with only the flexible circuit board 10F as in the first embodiment shown in FIG. 3A, or, as in the second and third embodiments shown in FIGS. 4A and 5A, may be configured with a combination of the flexible circuit board 10F and the rigid circuit board 10R, which are different from each other and include different materials.

Referring to FIGS. 3A, 4A, and 5A, the circuit board 10 may include the first connection end E1 forming a contact with the input/output connector C and the second connection end E2 forming a contact with the OSA package OSA, to form both ends of the multi-signal lines L, through the first through third embodiments, and, according to an embodiment, the first and second connection ends E1 and E2 may be formed as both ends of the flexible circuit board 10F.

According to an embodiment, the first and second connection ends E1 and E2 being formed at both ends of the flexible circuit board 10F may refer to the first and second connection ends E1 and E2 being formed at one end and the other end of the continuously extending flexible circuit board 10F, respectively, and the flexible circuit board 10F may include the first and second connection ends E1 and E2 formed at one end and the other end thereof while extending in a continuous form without intervening a discontinuous interface.

Figure 6A:
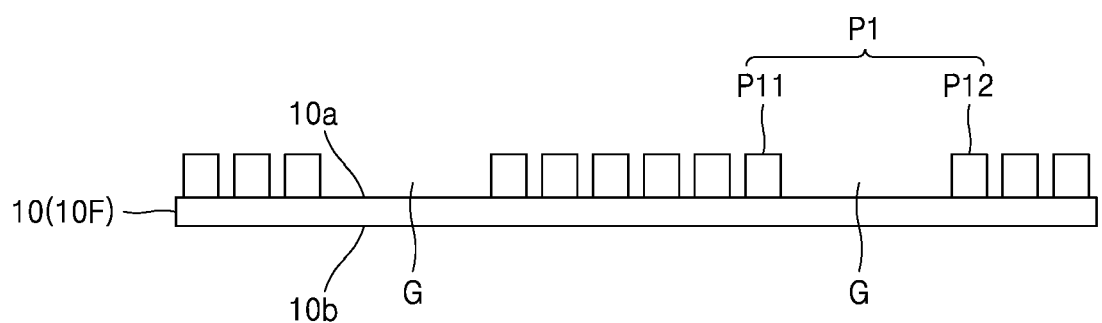
Figure 6B:
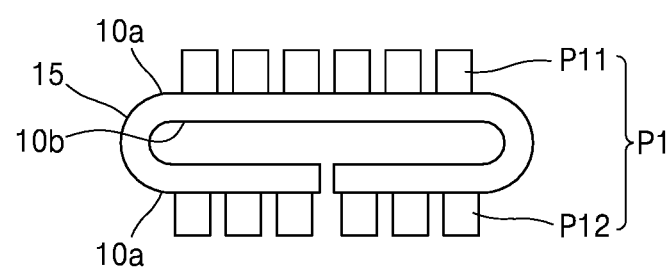
Figure 6C:
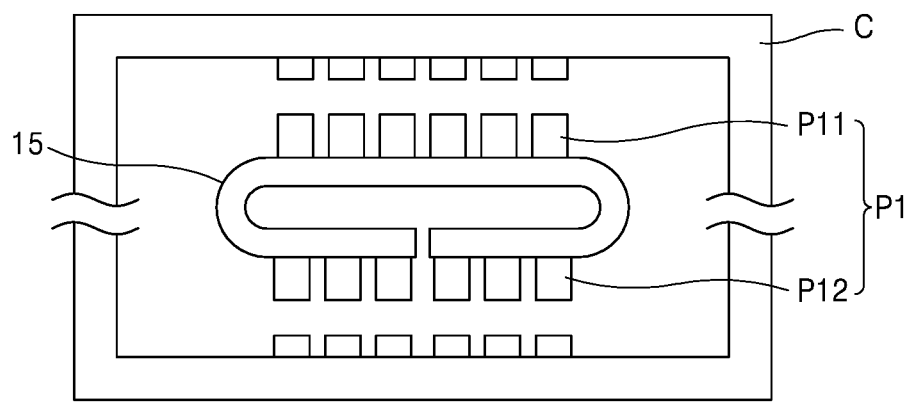
Figure 7:
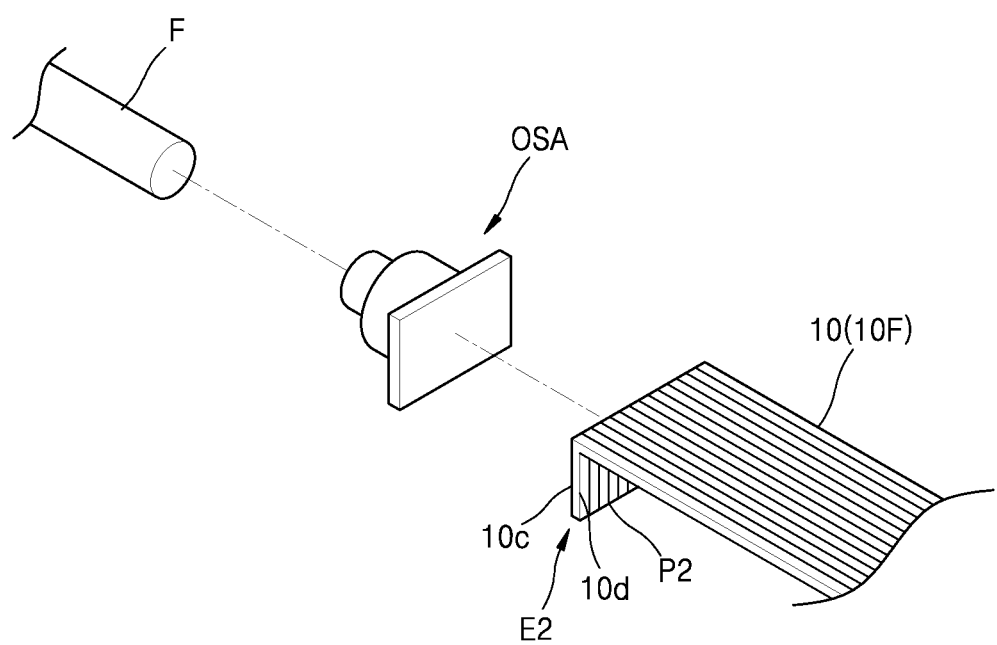
FIG. 7 is a view showing a configuration of the second connection end of FIG. 2.

FIGS. 6A through 6C are cross-sectional views taken along line VI-VI of FIG. 3A, showing the configuration of the first connection end E1 according to an embodiment. FIG. 6A shows an unfolded configuration of the first connection end E1, FIG. 6B shows the first connection end E1 folded in a curved form, and FIG. 6C schematically shows an electrical connection between the first connection end E1 shown in FIG. 6B and the input/output connector C. FIG. 7 is a view showing a configuration of the second connection end E2 of FIG. 2.

According to an embodiment, the first connection end E1 on which the first contact point P1 with the input/output connector C is formed may be formed by folding the first connection end E1 having a connection surface 10a on which which the first contact point P1 is formed in a curved shape, in order to form two upper and lower contacts with the input/output connector C formed as a standard. To this end, the first connection end E1 may be formed as one end of the flexible circuit board 10F that may be relatively flexibly bent. The second connection end E2, on which the second contact point P2 with the OSA package OSA is formed, may optically couple the OSA package OSA to the optical fiber F to output an optical signal from the OSA package OSA to an end of the optical fiber F, and the second connection end E2 on which the second contact point P2 is formed may be formed in a curved shape to stand in parallel to the OSA package OSA to face the OSA package OSA. To this end, the second connection end E2 may be formed as the other end of the flexible circuit board 10F that may be bent relatively flexibly.

As described above, according to an embodiment, the first and second connection ends E1 and E2 may be formed as one end and the other end of the flexible circuit board 10F to form a double-sided contact with the input/output connector C through folding of the first connection end E1 having the connection surface 10a on which the contact point P1 is formed, and the second contact point P2 facing the OSA package OSA may be formed through bending of the second connection end E2 to form optical coupling that minimizes optical loss between the OSA package OSA and the optical fiber F. As described above, the first and second connection ends E1 and E2 may be formed as one end and the other end of the flexible circuit board 10F having flexibility suitable for their folding or bending.

In the first through third embodiments shown in FIGS. 3A, 4A, and 5A, the flexible circuit board 10F having the first and second connection ends E1 and E2 formed at both ends may provide a high-speed transmission line having a relatively-small dielectric loss. In more detail, according to an embodiment, the video signal lines (first group of signal lines L1) requiring high-speed transmission in synchronization with a high-speed clock signal may be formed entirely on the flexible circuit board 10F on which the first and second connection terminals E1 and E2 are formed. In more detail, the flexible circuit board 10F may have a low dielectric loss so as to be suitable for high-speed transmission, and may include, for example, an insulating layer formed of a material having a low dielectric constant or a low capacitance to have a relatively-thin film thickness. For example, according to an embodiment, the flexible circuit board 10F may include an insulating layer made of polyimide.

Referring to FIGS. 6A through 6C and FIG. 7, according to an embodiment, the circuit board 10 on which the first and second connection ends E1 and E2 are formed may be formed as the flexible circuit board 10F relatively easy to bend, in order to fold the first connection end E1 for forming a double-sided contact with the input/output connector C as a standard and also to bend the connection end E2 forming a face-to-face contact with the OSA package OSA forming the optical coupling with the end of the optical fiber F, and the video signal lines (first group of signal lines L1) requiring a high-speed transmission path may be formed on the flexible circuit board 10F including an insulating layer having a relatively-low permittivity or capacitance and having a relatively-thin film thickness in order to reduce a transmission line dielectric loss.

According to the first through third embodiments shown in FIGS. 3A, 4A, and 5A, the first and second connection ends E1 and E2 may be formed as one end and the other end of the flexible circuit board 10F, the first contact point P1 formed on the first connection end E1 may form an electrical contact with the input/output connector C, and the second contact point P2 formed on the second connection end E2 may form an electrical contact with the OSA package OSA. In this case, the multi-signal lines L may extend between the second contact points P1 and P2 by using the first contact point P1 of the first connection end E1 and the second contact point P2 of the second connection end E2 as one end and the other end of the multi-signal lines L, respectively. The video signal lines requiring high-speed transmission, namely, the signal lines L1 of the first group, among the multi-signal lines L, may be completely formed on the flexible circuit board 10F so as not to deviate from the flexible circuit board 10F between the first and second contact points P1 and P2. For example, the signal lines L1 of the first group may be entirely formed on the flexible circuit board 10F, and accordingly, the signal lines L1 of the first group may not deviate from the entirety of the flexible printed circuit board 10F including the first and second contact points P1 and P2 forming both ends thereof and portions between the first and second contact points P1 and P2.

Looking at the second and third embodiments shown in FIGS. 4A and 5A, the second group signal lines L2, in addition to the first group signal lines L1 among the multi-signal lines L, may extend from the flexible circuit board 10F where the first and second contact points P1 and P2 are formed, and may include a detour transmission path between a location 11 deviating from the flexible circuit board 10F and a location 12 re-entering the flexible circuit board 10F between the first and second contact points P1 and P2. Through this specification, the detour transmission path may refer to, for example, a transmission path in a form exiting from the flexible circuit board 10F on which the first and second contacts P1 and P2 are formed and re-entering the flexible circuit board 10F, without considering the physical arrangement and orientation of a transmission path, may refer to a transmission path connecting between the location 11 deviating from the flexible circuit board 10F and the location 12 re-entering the flexible circuit board 10F, and may refer to a transmission path formed outside the flexible circuit board 10F. For example, according to various embodiments, as in the second embodiment shown in FIG. 4A, the detour transmission path may form a curved trajectory along a width direction of the flexible circuit board 10F in contrast with the first group of signal lines L1 each generally extending along a length direction of the flexible circuit board 10F between the first and second contact points P1 and P2. In more detail, along the signal lines L2 of the second group, the detour transmission path may form the location 11 deviating from the flexible circuit board 10F while being bent in the width direction of the flexible circuit board 10F toward the rigid circuit board 10R connected to one side of the flexible circuit board 10F in the width direction of the flexible circuit board 10F, and may form the location 12 re-entering the flexible circuit board 10F while being bent in the width direction from the rigid circuit board 10R toward the flexible circuit board 10F after passing through the IC mounted on the rigid circuit board 10R.

In contrast with the second embodiment shown in FIG. 4A, in the third embodiment shown in FIG. 5A, the second group of signal lines L2 may extend in the length direction of the flexible circuit board 10F, similar to the first group of signal lines L1 each generally extending along the length direction of the flexible circuit board 10F between the first and second contact points P1 and P2, and, along the signal lines L2 of the second group, the detour transmission path may form a location 11 deviating from the flexible circuit board 10F while generally extending in the length direction of the flexible circuit board 10F toward the rigid circuit board 10R connected to one side of the flexible circuit board 10F through an opening OP, and may form a location 12 re-entering the flexible circuit board 10F while generally extending in the length direction of the flexible circuit board 10F from the rigid circuit board 10R toward the flexible circuit board 10F after passing through the IC mounted on the rigid circuit board 10R. As described above, according to the detailed design of the detour transmission path or a relative arrangement relationship between the flexible circuit board 10F and the rigid circuit board 10R, the trajectory of the detour transmission path may be formed in a form that is bent along in the width direction of the flexible circuit board 10F or may be formed in a form generally extending in the length direction of the flexible circuit board 10F. For example, according to an embodiment, when any one signal line among the first and second groups of signal lines L1 and L2 each extending between the first and second contact points P1 and P2 generally extends in the length direction of the circuit board 10F, the other signal line may be formed to be bent in the width direction of the flexible circuit board 10F. For example, as shown in FIG. 4A, in a structure in which the rigid circuit board 10R is connected to one side of the flexible circuit board 10F in the width direction of the flexible circuit board 10F extending with a substantially uniform width, the signal lines L1 of the first group may generally extend in the length direction of the flexible circuit board 10F but the second group of signal lines L2 may extend in a form curved in the width direction of the flexible circuit board 10F, and, as shown in FIG. 5A, in a structure in which the rigid circuit board 10R is connected to one side of the flexible circuit board 10F through the opening OP formed in the width direction of the flexible circuit board 10F, the signal lines L2 of the second group may each generally extend in the length direction of the flexible circuit board 10F, and the signal lines L1 of the first group may each extend in a shape curved in the width direction of the flexible circuit board 10F.

In the first through third embodiments shown in FIGS. 3A, 4A, and 5A, the first connection end E1 of the flexible circuit board 10F on which the first contact point P1 is formed may form a wide portion having a maximum width in the length direction of the flexible circuit board 10F. Referring to FIGS. 6A through 6C, according to an embodiment, the first connection end E1 may form a double-sided contact with the input/output connector C while being folded in a curved shape so that the connection surface 10a on which the first contact point P1 is formed forms an outer circumference and a non-connection surface 10b on which the first contact point P1 is not formed forms an inner circumference, and the first connection end E1 may form substantially the same width as the other portions of the flexible circuit board 10F (see FIG. 2) while being folded in a curved form, and, in an unfolded state, the first connection end E1 may form a wide portion having a maximum width in the length direction of the flexible circuit board 10F. For example, as in the embodiment shown in FIG. 3A, the flexible circuit board 10F may be formed in a T shape that having the first connection end E1 at one end as the wide portion and the other portion having a substantially uniform width by including the second connection end E2 at the other end, and, as in the embodiment shown in FIG. 5A, while the opening OP is being formed in the flexible circuit board 10F for connection with the rigid circuit board 10R, a bottleneck portion of the flexible circuit board 10F excluding the opening OP may form a narrow portion that is narrowest in the width direction of the flexible circuit board 10F.

In the first through third embodiments shown in FIGS. 3A, 4A and 5A, because the multi-signal lines L uses the flexible circuit board 10F having the first and second contact points P1 and P2 formed at its both ends as a transmission side and a reception side of a transmission path, both ends of the multi-signal lines L may be formed on the flexible circuit board 10F.

Referring to FIGS. 4A and 5A, portions of the above-described first group of signal lines L1 among the multi-signal lines L between the first and second contact points P1 and P2 are also formed on the flexible circuit board 10F, whereas the second group of signal lines L2 other than the first group of signal lines L1 may include a detour transmission path deviating from the flexible circuit board 10F, and according to an embodiment, the detour transmission path between the location 11 deviating from the flexible circuit board 10F and the location 12 re-entering the flexible circuit board 10F may be provided on the rigid circuit board 10R electrically connected to the flexible circuit board 10F. In more detail, according to an embodiment, the second group of signal lines L2 may include a transmission path of the flexible circuit board 10F from the first contact point P1 to the deviating location 11, a detour transmission path of the rigid circuit board 10R from the deviating location 11 to the re-entering location 12, and a transmission path of the flexible circuit board 10F from the re-entering location 12 to the second contact point P2. As will be described later, an IC may be connected on the detour transmission path of the rigid circuit board 10R, and an IC chip, a peripheral circuit configuration, and wiring connected thereto may be intensively arranged on the rigid circuit board 10R providing the detour transmission path.

As described above, the first group of signal lines L1 formed on the flexible circuit board 10F as a whole may correspond to video signal lines requiring high-speed transmission, and the second group of signal lines L2 including the detour transmission path of the rigid circuit board 10R may correspond to auxiliary signal lines through which auxiliary data for video reproduction or communication of a video signal is transmitted instead of the video signal.

In more detail, the auxiliary signal lines (second group of signal lines L2) responsible for transmitting an auxiliary signal having a relatively low frequency may use the first and second contact points P1 and P2 formed on the flexible circuit board 10F as their both ends, and may include a detour transmission path that detours from the first and second contact points P1 and P2 at both ends to pass through the rigid circuit board 10R. According to an embodiment, an IC (e.g., a field programmable gate array (FPGA) or an IC chip) connected to the auxiliary signal lines (second group signal lines L2) to achieve signal processing may be disposed on the rigid circuit board 10R. At this time, the rigid circuit board 10R is easy to intensively form a plurality of wires for electrical connection of an IC and a peripheral circuit device connected to the IC, and may be configured with higher integration than the flexible circuit board 10F because a plurality of circuit devices are able to be intensively configured on both surfaces of the rigid circuit board 10R. For example, the auxiliary signal lines (second group of signal lines L2) may transmit information about at least one of the source device and the sink device in which the optical communication module M according to an embodiment forms a communication channel, for example, auxiliary data related to EDID (Extended Display Identification Data), which is configuration information and control information of the sink device, and DPCD (Display Port Configuration Data), which is reception condition information of the sink device, and, for example, an IC (e.g., an FPGA or an IC chip) for processing these various types of data together with fields indicating the various types of data into a single data packet form may be connected to the auxiliary signal lines (second group of signal lines L2). In this case, an IC that performs signal processing with respect to various types of data may be connected on the auxiliary signal lines (second group of signal lines L2), and the auxiliary signal lines (second group of signal lines L2) may include a detour transmission path that detours from the flexible circuit board 10F on which the first and second contact points P1 and P2 are formed to pass through the rigid circuit board 10 on which the IC is disposed.

According to an embodiment, the video signal lines (first group of signal lines L1) that transmit video signals synchronized with a clock signal of a relatively high frequency may be formed as a high-speed transmission line, and, when the video signal lines (first group of signal lines L1) are formed across a boundary between the flexible circuit board 10F and the rigid circuit board 10R having different material properties (material properties of insulating layers) in the circuit board 10 forming electrical coupling (e.g., capacitive coupling) with the video signal lines (first group of signal lines L1), the permittivities or capacitances of the flexible circuit board 10F and the rigid circuit board 10R are different from each other, and thus the boundary between the flexible circuit board 10F and the rigid circuit board 10R may be affected by distortion or reflection of video signals transmitted along the video signal lines (first group of signal lines L1) and attenuation of the video signals or generation of a counter-propagating noise component resulting from the distortion or reflection. Therefore, according to an embodiment, at least the video signal lines (first group of signal lines L1) among the multi-signal lines L may be entirely formed within the flexible circuit board 10F. According to an embodiment, the first and second contact points P1 and P2 forming one end and the other end of the multi-signal lines L including video signal lines may be formed on the flexible circuit board 10F, and the video signal lines (first group of signal lines L1) each extending between the first and second contact points P1 and P2 formed on the flexible circuit board 10F may extend between the second contact points P1 and P2 so as not to deviate from the flexible circuit board 10F. In other words, according to an embodiment, the first contact point P1 with the input/output connector C and the second contact point P2 with the OSA package OSA may be included, the video signal lines (first group of signal lines L1) extending between the first and second contact points P1 and P2 may be completely or wholly formed on the flexible circuit board 10F, and the rigid circuit board 10R may not be involved in transmission of video signals. For example, according to an embodiment, the video signal lines (first group of signal lines L1) may extend across the inside of the flexible circuit board 10F so as not to entirely deviate from the flexible circuit board 10F, and may be formed inside the flexible circuit board 10F so as not to come into contact with the boundary between the flexible circuit board 10F and the rigid circuit board 10 along the video signal lines (first group of signal lines L1).

In the second embodiment shown in FIG. 4A, among the multi-signal lines L using, as their both ends, the first and second contact points P1 and P2 formed on the flexible circuit board 10F, the first group of signal lines L1 (corresponding to the video signal lines), including the first and second contact points P1 and P2 and an area between the first and second contact points P1 and P2, may be entirely formed on the flexible circuit board 10F, and the second group of signal lines L2 (corresponding to auxiliary signal lines) different from the first group of signal lines L1 may include the detour transmission path deviating from the flexible circuit board 10F having the first and second contact points P1 and P2 formed thereon, and may be formed on the rigid circuit board 10R on which the detour transmission path is formed by deviating from the flexible circuit board 10F. In the first embodiment shown in FIG. 3A, the multi-signal lines L using, as their both ends, the first and second contact points P1 and P2 formed on the flexible circuit board 10F may be entirely formed on the flexible circuit board 10F, and both the first group of signal lines L1 (corresponding to the video signal lines) and the second group of signal lines L2 (corresponding to the auxiliary signal lines) requiring high-speed transmission may be entirely flexible circuit board 10F. For example, through various modifications of the first embodiment, an IC electrically connected to the second group of signal lines L2 may or may not be mounted on the flexible circuit board 10F. The optical communication module M according to the first embodiment may not include the rigid circuit board 10R connected to the flexible circuit board 10F, in addition to the flexible circuit board 10F.

Structures of the first connection end E1 and the second connection end E2 according to an embodiment will now be described.

Referring to FIGS. 6A through 6C and FIG. 7, the first connection end E1 forming one end of the flexible circuit board 10F may include the first contact point P1 with the input/output connector C, and the second connection end E2 forming the other end of the flexible circuit board 10F may include the second contact point P2 with the OSA package OSA. According to an embodiment, the first connection end E1 may form a double-sided contact with the input/output connector C, and the second connection end E2 may form a face-to-face contact with the OSA package OSA.

Through the present specification, the first connection end E1 and the input/output connector C forming a double-sided contact may refer to the first connection end E1 and the input/output connector C forming electrical contact on both upper and lower sides, for example, to the first connection end E1 and the input/output connector C forming an electrical contact for transmitting different signals to the input/output connector C through the upper and lower portions of the first connection end E1 in a height direction of the flexible circuit board 10F that is perpendicular to the length direction and the width direction of the flexible circuit board 10F. The formation of upper and lower double-sided contacts by the first connection end E1 and the input/output connector C may reduce a space allocation between the first connection end E1 and the input/output connector C for transmission of multiple signals, for example, reduce the widths of the first connection end E1 and the input/output connector C.

Through this specification, the second connection end E2 and the OSA package OSA forming a face-to-face contact may refer to the second connection end E2 and the OSA package OSA forming electrical contact with each other while standing to face each other. For example, according to an embodiment, the OSA package OSA may receive an electrical signal through the multi-signal lines L, and may be disposed to stand in the height direction of the flexible circuit board 10F so that an optical signal is transmitted in the length direction of the flexible circuit board 10F, and the second connection end E2 may also be bent into a standing form to form a face-to-face contact with the OSA package OSA disposed in this standing form.

The first connection end E1 may include the connection surface 10a on which the first contact point P1 is formed and the non-connection surface 10b on which the first contact point P1 is not formed, and may be folded in a curved shape such that the connection surface 10a forms the outer circumference and the non-connection surface 10b forms the inner circumference. A plurality of first contact points P1 may be formed on the connection surface 10a of the first connection end E1 and may include a group of upper first contact points P11 and a group of lower first contact points P12 along the outer circumference of the first connection end E1, and a separation gap G forming a curved portion 15 may be interposed between the group of upper first contact points P11 and the group of lower first contact points P12.

According to an embodiment, while the first connection end E1 is being unfolded, the group of upper first contact points P11 may be disposed at a central position in the width direction of the first connection end E1, and the group of lower first contact points P12 may be formed in pairs at both edges of the group of upper first contact points P1. At this time, the separation gap G may be interposed between the group of upper first contact points P11 and the group of lower first contact points P12. According to an embodiment, the separation gap G may be formed between the group of upper first contact points P11 disposed at the central position and each of pairs in which the group of lower first contact points P12 are formed at both edges, so that a pair of separation gaps may be formed in the width direction of the first connection end E1, and may form curved portions 15 on both left and right sides during folding.

According to an embodiment, folding of the first connection end E1 may be performed as follows. In other words, the connection surface 10a on which the first contact point P1 is formed may be used as the outer circumference and the non-connection surface 10b on which the first contact point P1 is not formed may be used as the inner circumference, the first connection end E1 may be folded so that the upper first contact points P11 formed at the center position in the width direction of the flexible circuit board 10F are disposed as an upper layer and the lower first contact points P12 disposed at both edges of the center position are disposed as a lower layer, and the upper first contact points P11 and the lower first contact points P12 may entirely form a vertically multi-layered structure through folding of the first connection end E1. According to an embodiment, the first connection end E1 on which the upper first contact points P11 and the lower first contact points P12 are arranged in a multi-layered form, by folding the lower first contact points P12 disposed on one edge among both edges of the upper first contact points P11 in the width direction of the flexible circuit board 10F are arranged below the upper first contact points P11 and also folding the other lower first contact points P12 disposed at the other edge are arranged below the upper first contact points P11.

According to an embodiment, the group of upper first contacts P11 and the group of lower first contacts P12 may form the upper and lower double-sided contacts with the input/output connector C along the outer circumference of the first connection end E1, and may not form contacts with the input/output connector C on lateral surfaces of the first connection end E1 forming the curved portion 15. For example, no first contact points P1 are formed between the group of upper first contact points P11 and the group of lower first contact points P12 corresponding to the lateral surfaces of the first connection end E1, and the separation gaps G for forming the curved portions 15 during folding may be formed therebetween. For example, the separation gaps (G) are portions corresponding to the curved portions 15 of the first connection end E1, and, because the curved portions 15 of the first connection end E1 may not form sufficient contact with the input/output connector C according to the detailed folding shape of the first connection end E1, the first contact points P1 may not be formed on the curved portions 15 of the first connection end E1 in consideration of workability in a folding process without forming the first contact points P1.

Referring to FIG. 3A, according to an embodiment, with respect to the positions of the separation gaps G in state where the first connection end E1 is unfolded, the separation gaps G may be formed on a remaining portion of the flexible circuit board 10F except for the first connection end E1, for example, may be formed at a position corresponding to the width of a portion of the flexible circuit board 10F leading from the first connection end E1 in the length direction of the flexible circuit board 10F. According to an embodiment, the first connection end E1 may form a wide portion having a maximum width in the length direction of the flexible circuit board 10F in a state in which the first connection end E1 is unfolded in the width direction, and, when the first connection end E1 is folded in the width direction, the first connection end E1 may be formed with the same width as a width of the remaining portion except for the first connection end E1 in the length direction of the flexible circuit board 10F, for example, a width of the portion leading from the first connection end E1 in the length direction of the flexible circuit board 10F (see FIG. 2). To this end, the separation gaps G may be formed at positions corresponding to the width of the portion leading from the first connection end E1. For example, the optical communication module M according to an embodiment ranging from the input/output connector C at one end to the OSA package OSA at the other end may be formed to have a substantially uniform width. According to an embodiment, the first and second connection ends E1 and E2 forming both ends of the flexible circuit board 10F may have different widths when the first connection end E1 is unfolded as a single layer, and may have the same widths when the first connection ends E1 are folded in a multi-layered form.

According to an embodiment, the first connection end E1 may be folded in such a shape that both ends of the connection surface 10a on which the first contact points P1 are formed face each other so that the connection surface 10a forms the outer circumference, and thus, the group of lower first contact points P12 may be formed on the connection surfaces 10a disconnected from each other. For example, the group of lower first contact points P12 may include different lower first contact points respectively formed on the connection surfaces 10a separated from each other.

The second connection end E2 may be bent to stand to face the OSA package OSA so as to form a face-to-face contact with the OSA package OSA. For example, the second connection end E2 may be formed to be bent from the main body of the flexible circuit board 10F in the height direction perpendicular to the length and width directions of the flexible circuit board 10F, and the second connection end E2 and the OSA package OSA may be disposed facing each other on the second connection end E2 standing in the height direction. For example, the OSA package OSA, which is a combination of a base substrate and an optical device disposed on the base substrate, may include a light-emitting element forming a transmission terminal end side and a light-receiving element forming a reception terminal side, and may further include optical elements (e.g., optical lenses, etc.) optically coupled to the light-emitting element and the light-receiving element. At this time, the OSA package OSA being disposed in a standing shape in a height direction may refer to the base substrate being disposed in a standing shape in the height direction, and may also refer to an optical signal being output in the length direction of the flexible circuit board 10F through the optical elements arranged to have an output direction perpendicular to the base substrate standing in the height direction. For example, according to an embodiment, the second connection end E2 may include the connection surface 10c as one surface on which the second contact points P2 are formed and the non-connection surface 10d as the other surface, and the second connection end E2 may be bent to stand so that the connection surface 10c faces the OSA package OSA.

As described above, according to an embodiment, the first and second connection ends E1 and E2 forming both ends of the flexible circuit board 10F may be folded or bent to form a double-sided contact or a face-to-face contact with the input/output connector C and the OSA package OSA, respectively, and, considering the folding or bending, the first and second connection ends E1 and E2 may be formed as both ends of the flexible circuit board 10F.

According to an embodiment, an optical communication module capable of simplifying a contact structure with an input/output connector and reducing manufacturing costs, by improving the contact structure with the input/output connector, may be provided.

According to an embodiment, an optical communication module capable of providing a high-speed transmission line having a relatively-low dielectric loss with respect to a video signal requiring high-speed transmission in synchronization with a high-speed clock signal and also having an improved structure favorable to mounting of an integrated circuit for signal processing with respect to an auxiliary signal or a peripheral circuit device connected to the integrated circuit may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An optical communication module comprising:
   an input/output connector on one end through which a multi-signal including a video signal is input/output;
   an optical sub assembly (OSA) package on another end for converting the multi-signal into an optical signal; and
   a first connection end folded in a curved form so that a connection surface as one surface on which a first contact point is formed forms an outer circumference and a non-connection surface as another surface on which the first contact point is not formed forms an inner circumference to form upper and lower double-sided contacts with the input/output connector,
   wherein, among multi-signal lines, a second group of signal lines comprises a detour transmission path between a location deviating from a flexible circuit board and a location re-entering the flexible circuit board between the first contact point and a second contact point.

2. The optical communication module of claim 1, wherein, along the outer circumference of the connection surface, a group of upper first contact points and a group of lower first contact points are respectively formed on upper and lower sides that are opposite to each other, and a separation gap forming a curved portion is interposed between the group of upper first contact points and the group of lower first contact points.

3. The optical communication module of claim 2, wherein the group of lower first contact points comprises different lower first contact contacts each formed on connection surfaces separated from each other along the outer circumference of the connection surface.

4. The optical communication module of claim 1, further comprising a second connection end forming a contact point with the OSA package and bent so that the connection surface on which the second contact point is formed stands to face the OSA package.

5. The optical communication module of claim 4, wherein
   the first and second connection ends are formed as one end and another end of a flexible circuit board, and
   the multi-signal lines each extend between the first and second contact points by using the first contact point of the first connection end and the second contact point of the second connection end as the one end and the other end, respectively.

6. The optical communication module of claim 4, wherein the flexible circuit board continuously extends between the first and second connection ends.

7. The optical communication module of claim 1, wherein, among the multi-signal lines, a first group of signal lines is completely formed on the flexible circuit board so as not to deviate from the flexible circuit board between the first contact point and the second contact point with the OSA package.

8. The optical communication module of claim 7, wherein the first group of signal lines transmit video signals.

9. The optical communication module of claim 1, wherein the second group of signal lines transmits an auxiliary signal including information about at least one of a source device and a sink device through which the optical communication module provides a communication channel.

10. The optical communication module of claim 1, wherein the detour transmission path is provided as a rigid circuit board.

11. The optical communication module of claim 1, wherein the second group of signal lines comprises a transmission path of the flexible circuit board from the first contact point to deviating location, a detour transmission path of a rigid circuit board from the deviating location to re-entering location, and a transmission path of the flexible circuit board from the re-entering location to the second contact point.

12. The optical communication module of claim 1, wherein an integrated circuit chip is connected on the detour transmission path.

* * * * *